United States Patent
Ito

(10) Patent No.: US 9,698,342 B2
(45) Date of Patent: Jul. 4, 2017

(54) CONTACT LAYER FOR MAGNETIC TUNNEL JUNCTION ELEMENT AND MANUFACTURING METHOD THEREOF

(71) Applicant: Yuichi Ito, Seongnam-si (KR)

(72) Inventor: Yuichi Ito, Seongnam-si (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 60 days.

(21) Appl. No.: 14/630,376

(22) Filed: Feb. 24, 2015

(65) Prior Publication Data
US 2016/0079308 A1 Mar. 17, 2016

Related U.S. Application Data

(60) Provisional application No. 62/049,121, filed on Sep. 11, 2014.

(51) Int. Cl.
| | |
|---|---|
| H01L 43/02 | (2006.01) |
| H01L 43/08 | (2006.01) |
| H01L 43/12 | (2006.01) |
| H01L 27/22 | (2006.01) |

(52) U.S. Cl.
CPC ............ *H01L 43/12* (2013.01); *H01L 27/228* (2013.01); *H01L 43/08* (2013.01)

(58) Field of Classification Search
CPC ....... H01L 27/226; H01L 43/02; H01L 43/08; H01L 43/12
See application file for complete search history.

(56) References Cited

U.S. PATENT DOCUMENTS

| | | | |
|---|---|---|---|
| 6,528,390 B2 * | 3/2003 | Komori | H01L 21/76213 257/E21.556 |
| 8,264,023 B2 | 9/2012 | Takeuchi et al. | |
| 2011/0017971 A1 * | 1/2011 | Kim | H01L 27/10876 257/5 |
| 2011/0103153 A1 * | 5/2011 | Katsumata | G11C 16/0466 365/185.23 |
| 2011/0233697 A1 * | 9/2011 | Kajiyama | G11C 11/16 257/421 |

(Continued)

FOREIGN PATENT DOCUMENTS

JP        2003078184 A     3/2003

OTHER PUBLICATIONS

Bae et al. [KR1020140050867], Apr. 28, 2014, Machine Translation.*

*Primary Examiner* — John C Ingham
*Assistant Examiner* — Ismail Muse
(74) *Attorney, Agent, or Firm* — Holtz, Holtz & Volek PC

(57) ABSTRACT

According to one embodiment, a semiconductor memory device includes a magnetic tunnel junction (MTJ) element includes a first magnetic layer, a second magnetic layer and a non-magnetic layer between the first and second magnetic layers, a contact layer formed underneath the MTJ element, the contact layer being formed of a first material, and a first layer formed around the contact layer, wherein the first layer in contact with a side surface of the contact layer, has a first width extending parallel to a stacking direction of the MTJ element, and a second width extending perpendicularly to the direction of extension of the first width, the second width being less than the first width.

23 Claims, 14 Drawing Sheets

(56) References Cited

U.S. PATENT DOCUMENTS

| | | | |
|---|---|---|---|
| 2013/0015541 A1* | 1/2013 | Kanaya | H01L 43/08 257/421 |
| 2013/0292847 A1* | 11/2013 | Choi | H01L 23/498 257/774 |
| 2014/0087485 A1 | 3/2014 | Tomioka | |
| 2014/0284737 A1 | 9/2014 | Kumura | |
| 2015/0311433 A1* | 10/2015 | Bae | H01L 43/12 438/3 |

* cited by examiner

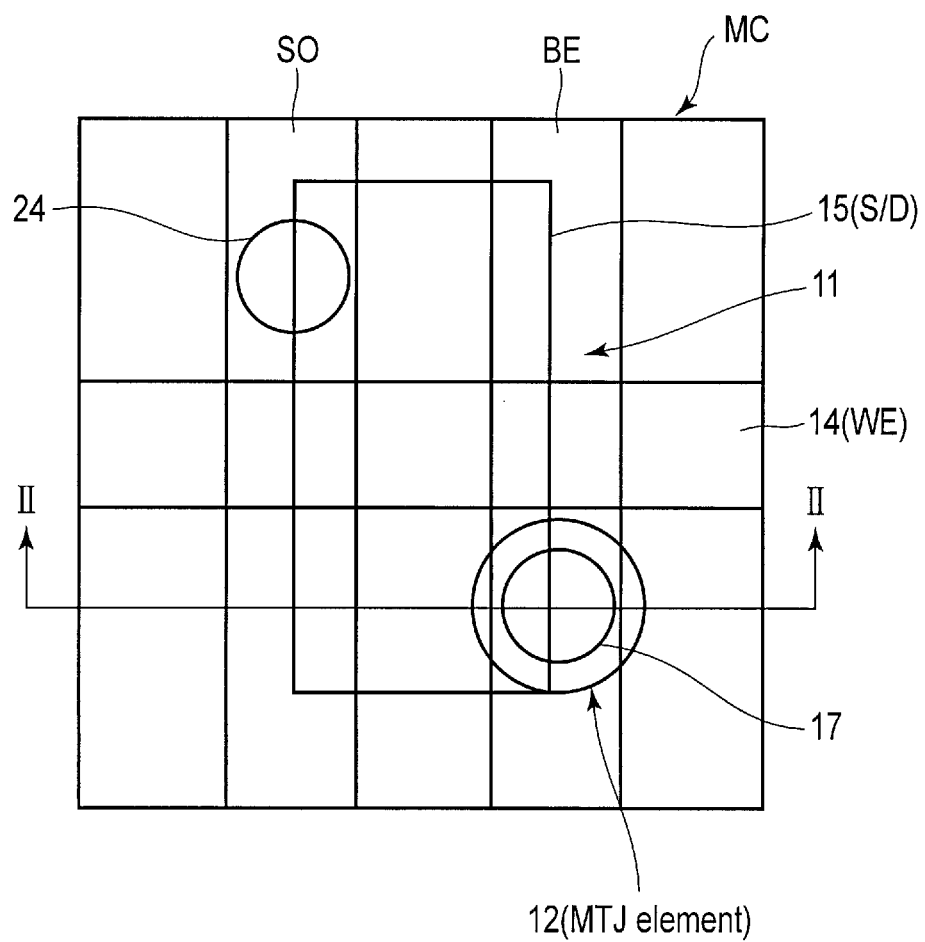
F I G. 1

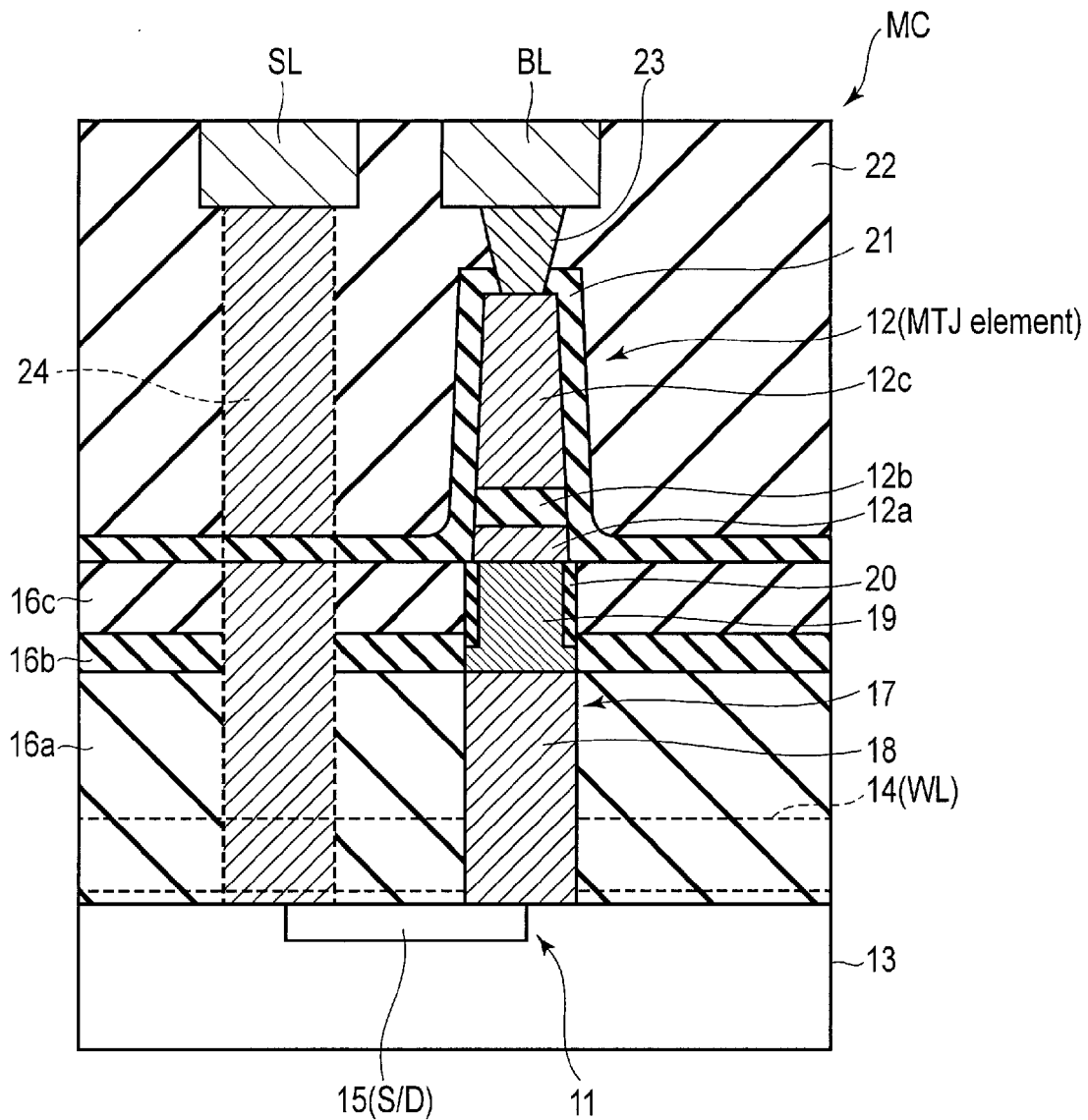
F I G. 2

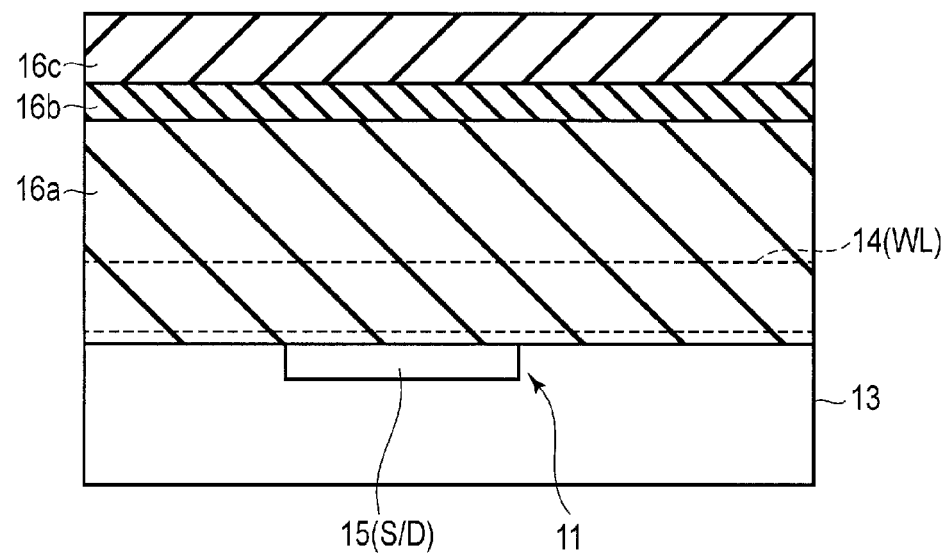
F I G. 3A
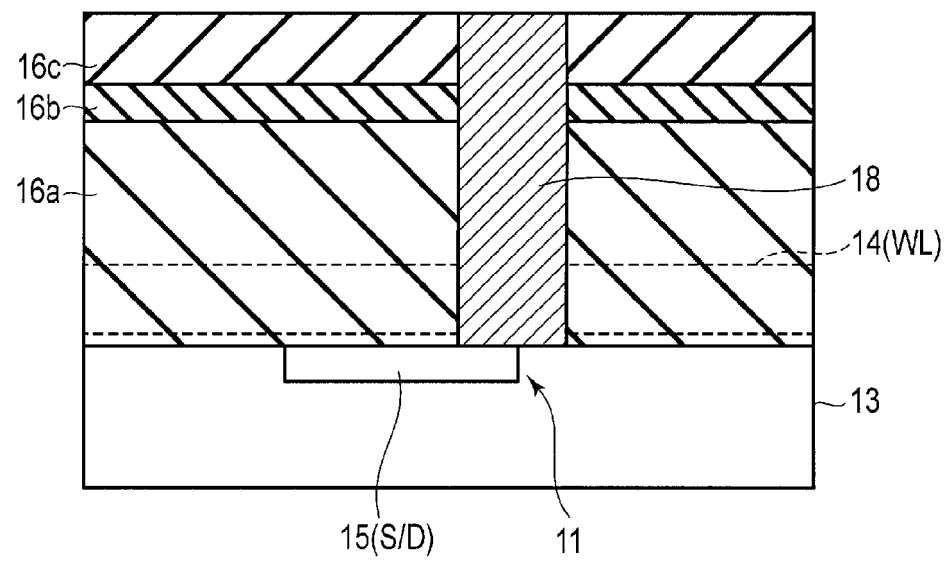
F I G. 3B

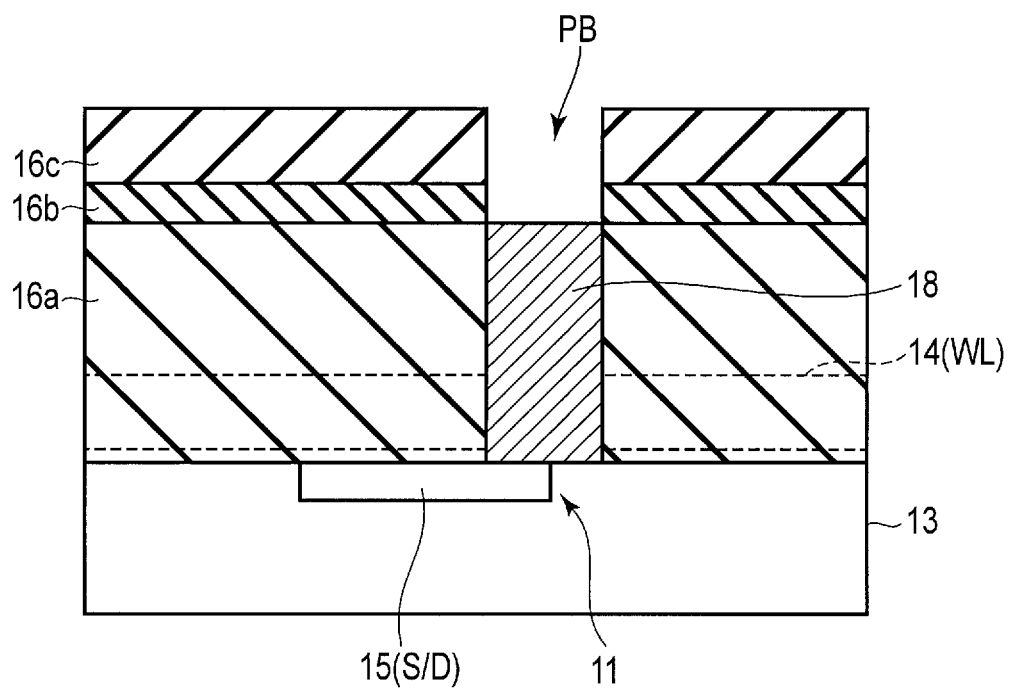
F I G. 4

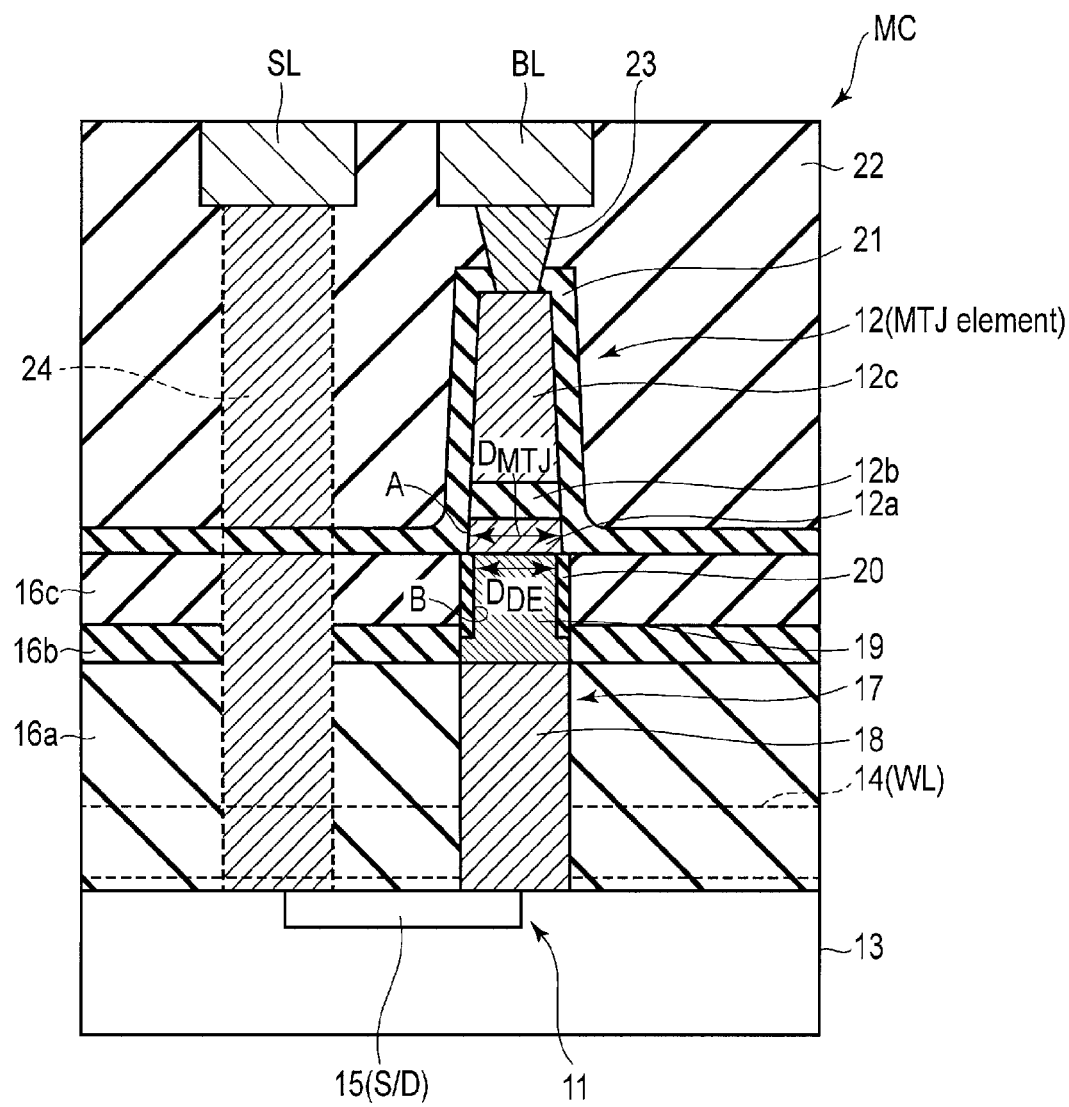
F I G. 10

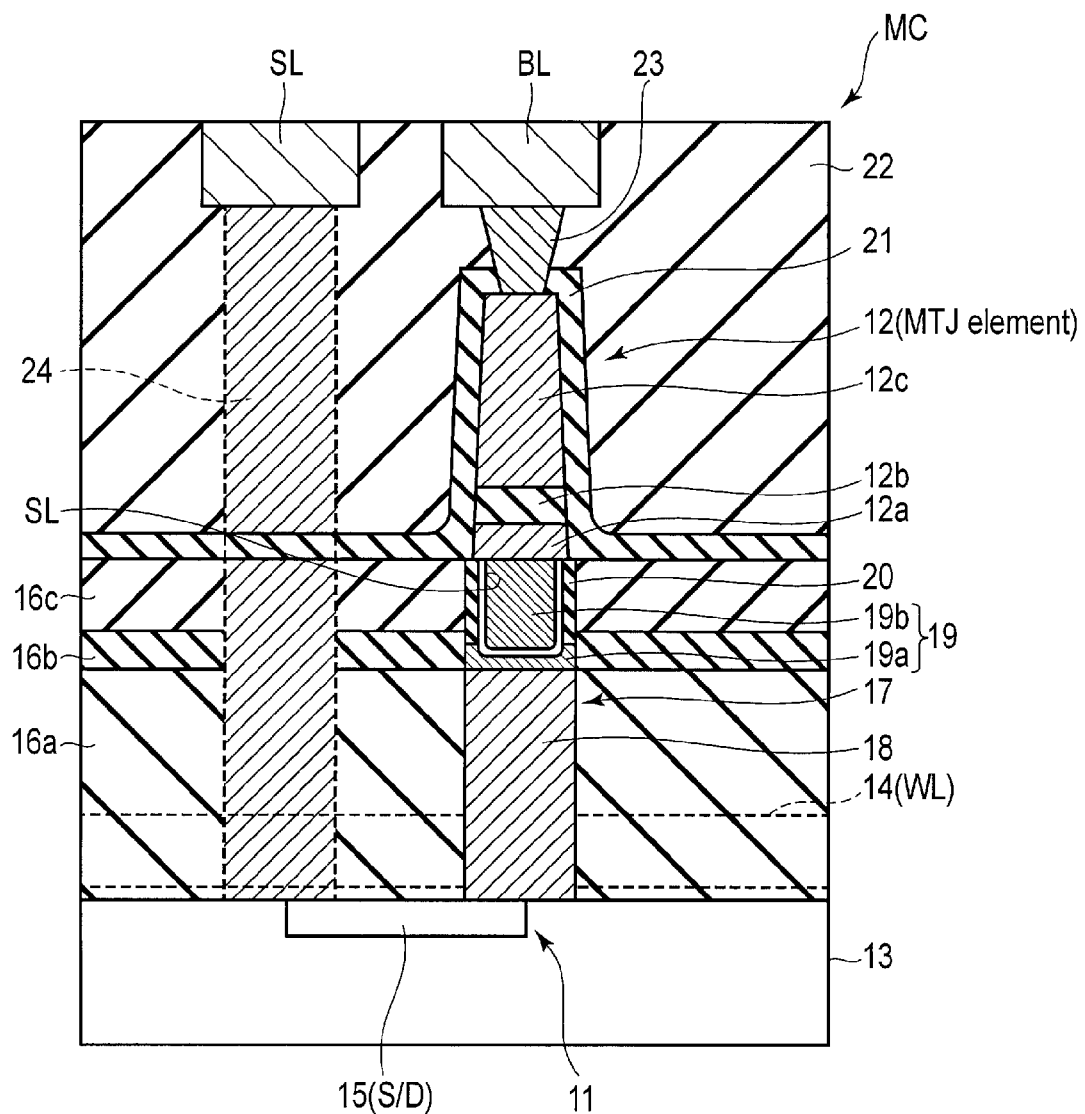
F I G. 12

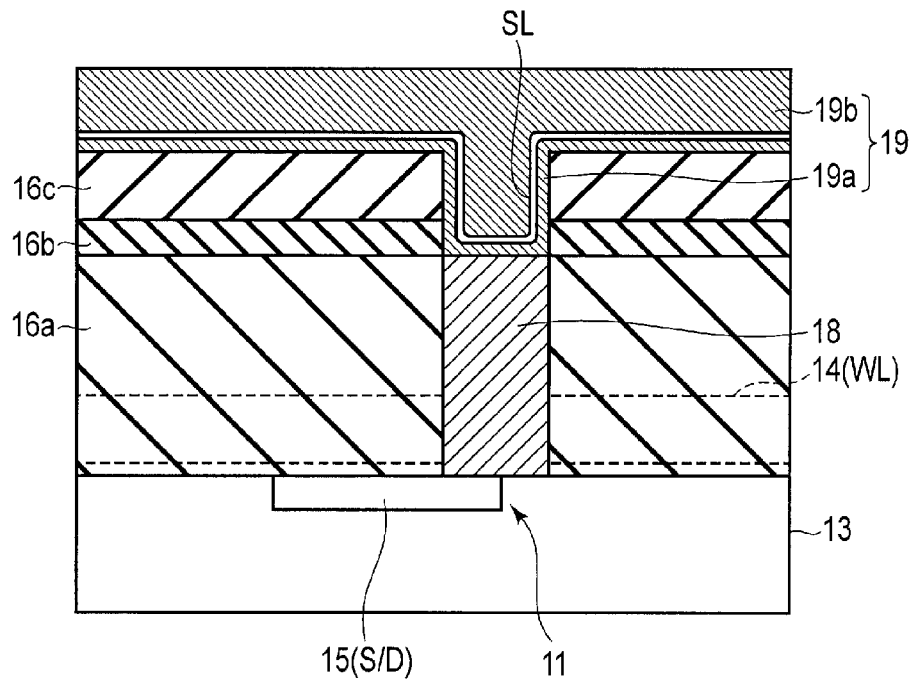
F I G. 13
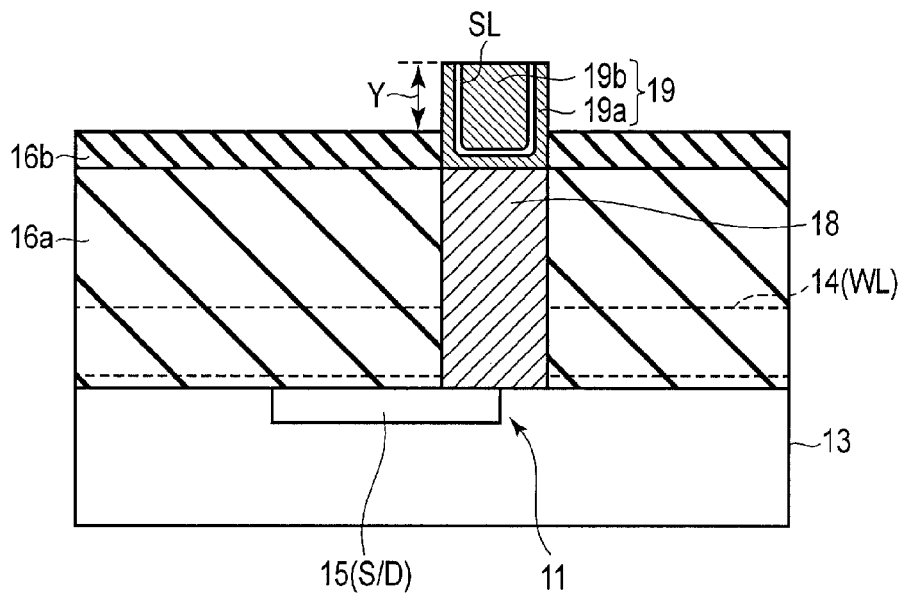
F I G. 14

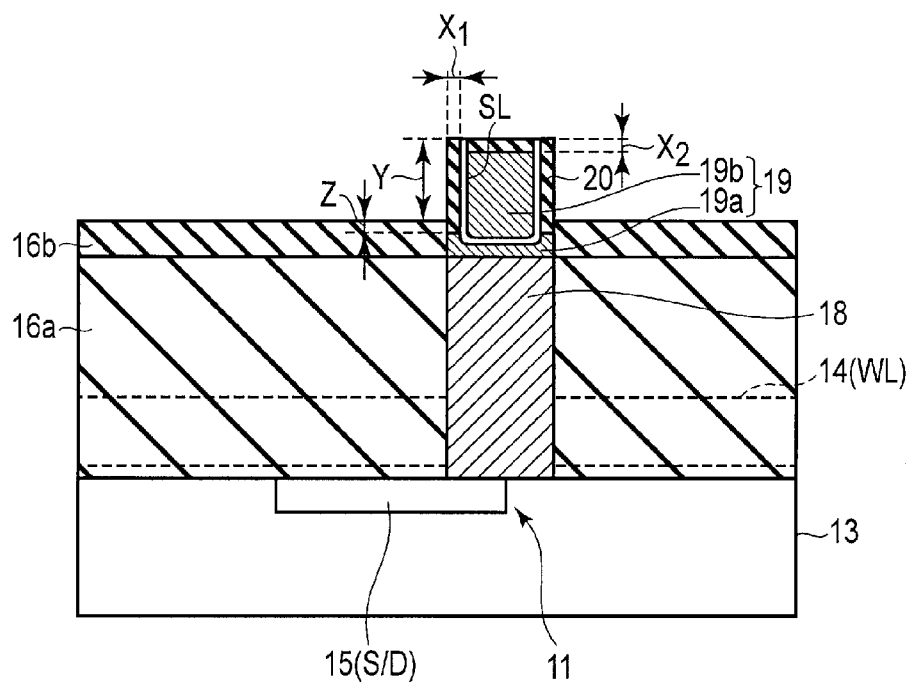
F I G. 15
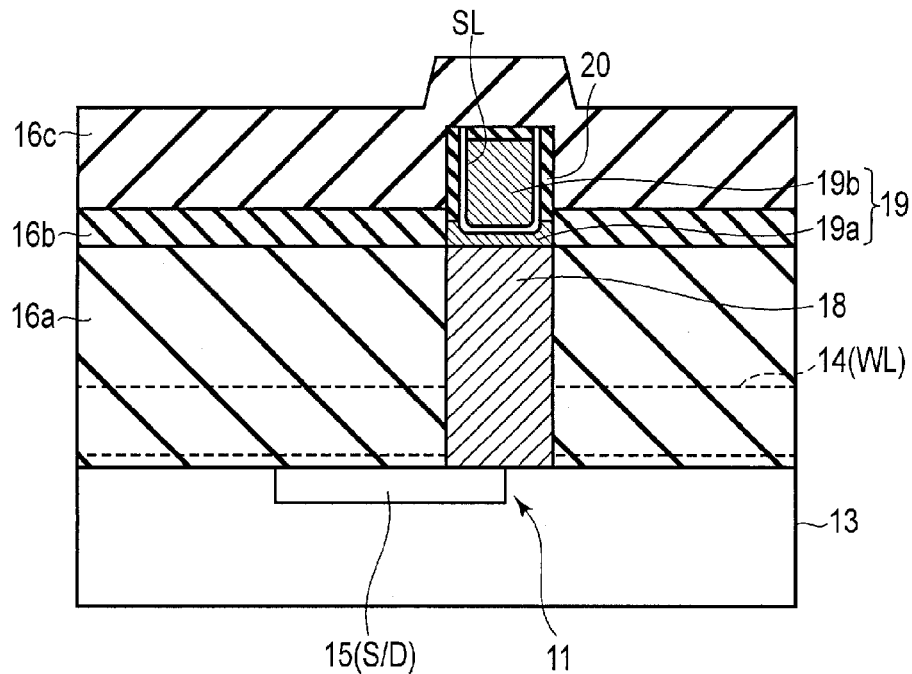
F I G. 16

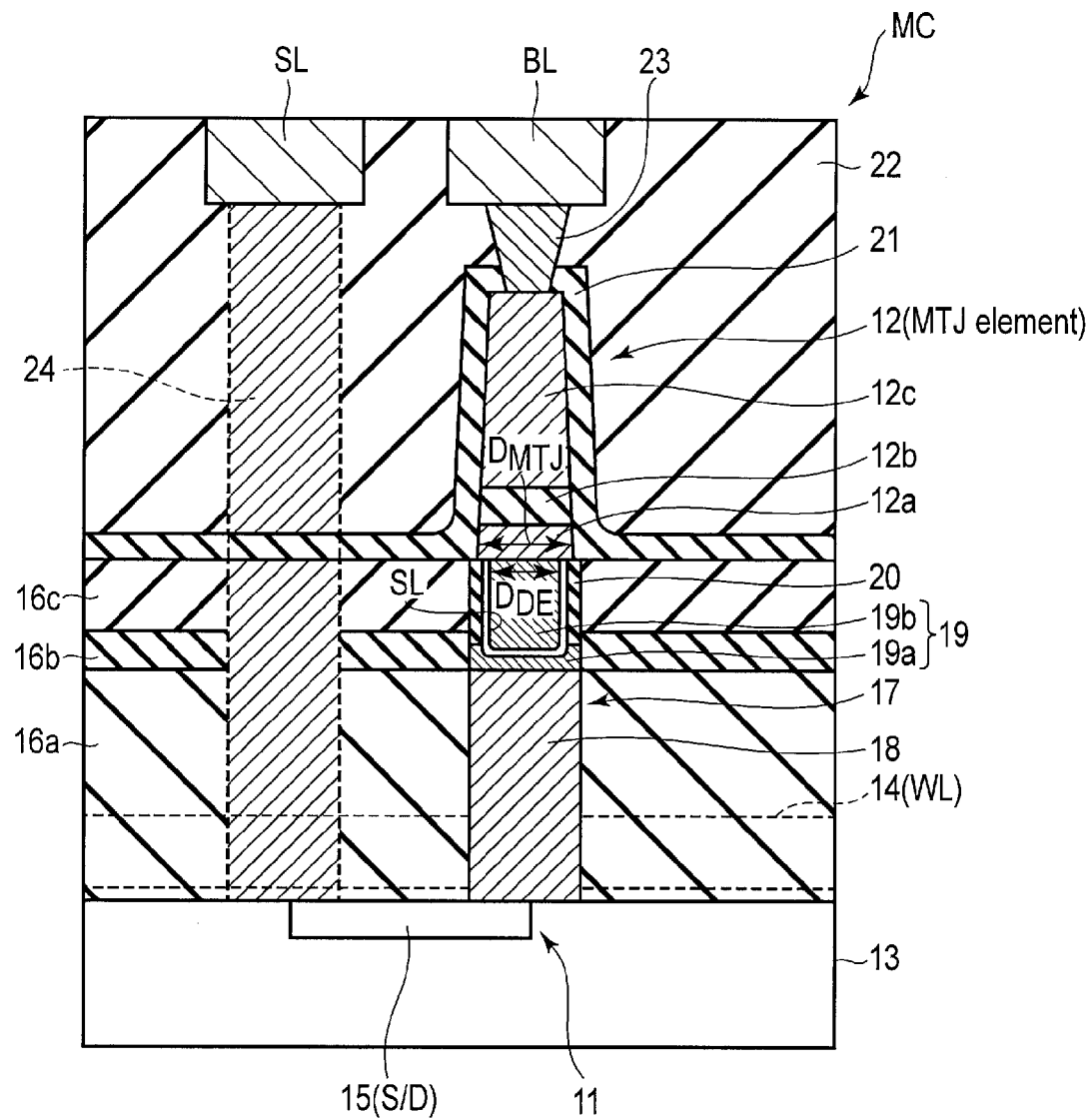
F I G. 17

CONTACT LAYER FOR MAGNETIC TUNNEL JUNCTION ELEMENT AND MANUFACTURING METHOD THEREOF

CROSS-REFERENCE TO RELATED APPLICATIONS

This application claims the benefit of U.S. Provisional Application No. 62/049,121, filed Sep. 11, 2014, the entire contents of which are incorporated herein by reference.

FIELD

Embodiments described herein relate generally to a semiconductor memory device applicable to, for example, a magnetoresistive random access memory (MRAM), and a method of manufacturing such a device.

BACKGROUND

The general term "MRAM" refers to a non-volatile semiconductor memory which utilizes a change in the resistance of the barrier layer depending on the direction of magnetization of the ferromagnetic material. A memory cell of an MRAM comprises a magnetic tunnel junction (MTJ) resistive element and a transistor. A lower electrode contact plug (referred to as a lower contact plug hereinafter) is formed on one diffusion layer of the transistor, and an MTJ element is formed on the lower contact plug.

BRIEF DESCRIPTION OF THE DRAWINGS

FIG. 1 is a plan view showing an example of a semiconductor memory device according to the first embodiment;

FIG. 2 is a cross-sectional view taken along II-II of FIG. 1;

FIGS. 3A, 3B, 4, 5, 6, 7, 8, 9 and 10 each are a cross-sectional view showing a method of manufacturing the semiconductor memory device according to the first embodiment;

FIG. 12 is a cross-sectional view showing a modified example of the first embodiment;

FIGS. 13 to 17 each are a cross-sectional view showing a method of manufacturing the semiconductor memory device according to the modified example of the first embodiment.

DETAILED DESCRIPTION

Figure 5:
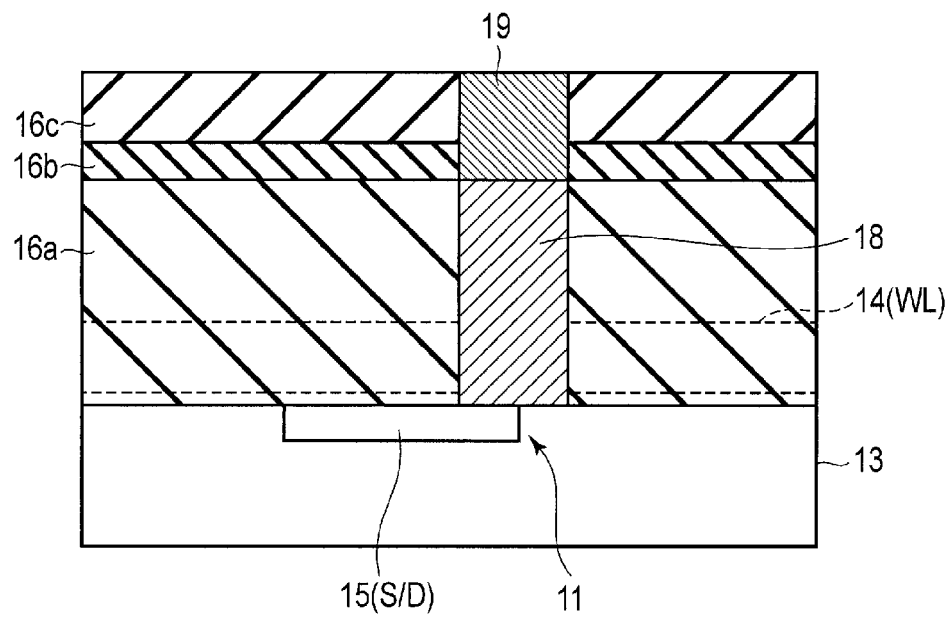

In general, according to one embodiment, a semiconductor memory device comprises a magnetic tunnel junction (MTJ) element comprising a first magnetic layer, a second magnetic layer and a non-magnetic layer between the first and second magnetic layers;

a contact layer formed underneath the MTJ element, the contact layer being formed of a first material; and a first layer formed around the contact layer, wherein the first layer in contact with a side surface of the contact layer, has a first width extending parallel to a stacking direction of the MTJ element, and a second width extending perpendicularly to the direction of extension of the first width, the second width being less than the first width.

As for the conventional MRAM, in which data is written with a magnetic field produced by a wire current, the coercive force increases as the MTJ element becomes smaller, and therefore there is a tendency for the current required for writing to become large. Thus, the conventional MRAM has such a drawback in that it is difficult to make cells smaller to increase memory capacity while reducing the required current.

To solve this, a spin-injection MRAM which employs a spin transfer torque (STT) writing mode has been proposed. The spin-injection MRAM writes data therein by allowing a current to flow directly to the MTJ element to change the direction of magnetization of the recording layer according to the direction of the current.

As mentioned above, the MTJ element is formed on a lower contact plug to electrically connect to the diffusion layer of the transistor. Here, it is known that an MTJ element is susceptible to the flatness of what is underneath. Therefore, when forming an MTJ element on a lower contact plug, it is required that the surface of the lower contact plug be sufficiently flat.

Further, during the processing of the MTJ element, the so-called overetching occurs in some cases, in which the lower contact plug is etched following the etching of the MTJ element. When an overetching occurs, part of material element of the lower contact plug redeposits on the sidewall of the MTJ element, which may cause a short-circuiting error between ferromagnetic layers, inadequate magnetic properties, for example, degradation in coercive force Hc of the storage layer, or in magnetoresistivity MR. In other words, if a conductive element re-attaches to a sidewall of the MTJ element, especially, a sidewall of a barrier layer, the characteristics of the MTJ element degrade. At the same time, if the overetching is inhibited, MTJ elements cannot be separated sufficiently, causing leakage between MTJ elements. As described, in terms of overetching, the degradation in characteristics of MTJ elements and the prevention of leakage between MTJ elements have a trade-off relationship against each other.

Under these circumstances, there has been a demand for a method which can prevents degradation in characteristics of MTJ elements even when overetching is fully carried out.

Embodiments will now be described with reference to the drawings, identical parts being designated by the same reference numbers or symbols.

First Embodiment

FIGS. 1 and 2 each show a semiconductor memory device according to the first embodiment, that is, for example, a memory cell MC of an MRAM. The memory cell MC comprises a transistor 11 and an MTJ element 12. For example, inside a silicon substrate 13, a shallow trench isolation (STI) layer is formed as an element separation layer. A gate electrode 14 of the transistor 11 is formed on the silicon substrate 13 via a gate insulating layer. The gate electrode 14 is connected to a gate electrode of another memory cell adjacent in a row direction, thus constituting a word line WL. In the silicon substrate 13 located on both sides of the gate electrode 14, diffusion layer 15 which comprises one of source/drain (S/D) layer is formed.

An interlayer insulator layer 16a which covers the transistor 11 is formed on the silicon substrate 13. On interlayer insulator layer 16a, another interlayer insulator layer 16b is formed, and sill another interlayer insulator layer 16c is formed form on the interlayer insulator layer 16b. Interlayer insulator layer 16a is, for example, a silicon oxide layer $SiO_2$. Interlayer insulator layer 16b is, for example, a silicon nitride layer SiN. Interlayer insulator layer 16c is, for example, a silicon oxide layer $SiO_2$. Interlayer insulator layer 16b serves as an etching stopper for the interlayer insulator layer 16c, which will be described later.

Within interlayer insulator layers 16a, 16b and 16c, a lower contact plug 17 is formed as a contact layer electrically connected to one of the diffusion layer 15, which comprises one of the S/D layer. The lower contact plug 17 comprises a first contact 18 and a second contact 19 formed thereon. The first contact 18 is formed of, for example, tungsten (W) or copper (Cu). The second contact 19 is formed on the first contact 18. The surrounding of the first contact 18 may be covered by a barrier metal layer. The barrier metal layer comprises, for example, Ti, TiN, Ta or a stack layer of TiN.

The second contact 19 is formed of, for example, tantalum (Ta). Note that the material of the second contact 19 is not limited to Ta, but it is also possible to apply one of such metals as TaN, Ti, TiN, Si, Hf and W.

A first layer 20 is formed around the second contact 19. The first layer 20 is formed of an oxide of the material of the second contact 19. For example is, when the second contact 19 contains one metal selected from Ta, Ti and Al, the first layer 20 contains an oxide or nitride of one of these elements. More specifically, when the second contact 19 is formed of tantalum, the first layer 20 is a tantalum oxide (TaOx) layer. Or when the second contact 19 is formed of hafnium, the first layer 20 is a hafnium oxide (HfOx) layer. The surface of the first layer 20 is flush with the surface of the second contact 19 to form a flat surface together with the surface of the second contact 19.

The surfaces of the first layer 20 and the second contact 19 are flush with the surface of interlayer insulator layer 16c, and they are situated within a contact hole PB.

The MTJ element 12 is formed on the surfaces of the second contact 19 and the first layer 20. The surface of the second contact 19 is smaller than the bottom surface of the MTJ element 12. With this structure, the memory cell MC can be miniaturized. But the edge of the MTJ element is located between the border between the first layer 20 and interlayer insulator layer 16c and the border between the first layer 20 and the second contact 19. In other words, the first layer 20 is formed in a section other than the bottom surface of the MTJ element, and thus the first layer 20 partially covers the bottom surface of the MTJ element.

The MTJ element 12 comprises, for example, a ferromagnetic layer 12a, a barrier layer 12b as a non-magnetic layer, and a ferromagnetic layer 12c. Of ferromagnetic layers 12a and 12c, one in which the direction of magnetization is fixed is called the pin layer, whereas one in which the direction of magnetization is inversed with an external magnetic field or STT is called the storage layer. In this embodiment, the MTJ element 12 is of a three-layered structure; however, the element is not limited to the three-layered structure, but may be modified into various versions. That is, for example, the reference layer may take such a structure that it comprises an interface which borders the barrier layer. Or the MTJ element 12 may comprise a first reference layer, a first barrier layer, a storage layer, a second barrier layer and a second reference layer.

The MTJ element 12 is covered by a protective layer 21 of, for example, silicon nitride or alumina. An insulating layer 22 is formed on the protective layer 21, and an upper contact plug 23, which is connected to the MTJ element 12, is formed in the insulating layer 22 and partly in the protective layer 21. A bit line BL is formed on the upper contact plug 23. The bit line BL is arranged in a direction orthogonal to the word line WL.

On the other hand, a contact 24 is formed in the parts of interlayer insulator layers 16a to 16c, the protective layer 21 and the insulating layer 22, which correspond to the other diffusion layer 15 which comprises the other one of the S/D layer. The contact 24 is electrically connected to the other diffusion layer 15 which comprises the other one of the S/D layer. A source line SL is formed on the contact 24. The source line SL is arranged along the bit line BL.

(Processing Method)

FIGS. 3A to 9 each show an example of the processing method of the lower contact plug.

As shown in FIG. 3A, the STI layer, which is not shown, is formed in the silicon substrate 13, and the gate electrode 14 of the transistor 11 is formed on the silicon substrate 13. Further, the diffusion layer 15, which comprises one of the S/D layer, are formed to sandwich the gate electrode 14. Next, interlayer insulator layer 16a is deposited on the silicon substrate 13 and the transistor 11, and the surface of interlayer insulator layer 16a is planarized. As for the material of interlayer insulator layers 16a to 16c, for example, a boron phosphorous silicate glass (BPSG) or plasma-tetra ethoxy silane (P-TEOS) or a laminated structure of one of these and a silicon nitride (SiN) layer is applicable. Further, interlayer insulator layer 16b is deposited on interlayer insulator layer 16a, interlayer insulator layer 16c is deposited on interlayer insulator layer 16c. Interlayer insulator layer 16b is, for example, a silicon nitride layer SiN, and interlayer insulator layer 16c is, for example, a silicon oxide layer $SiO_2$.

Interlayer insulator layers 16a to 16c each are selectively etched, and thus a contact hole PB is opened, which exposes the diffusion layer 15 which comprises one of the S/D layer.

After that, as shown in FIG. 3B, a metal material is filled into the contact hole PB, and then planarized by CMP, thus forming the first contact 18. Applicable examples of the material of the first contact 18 are W and Cu.

Then, as shown in FIG. 4, the first contact 18 is etched back, and thus a portion of the first contact 18 is recessed.

Next, as shown in FIG. 5, a material optimal for the characteristics of the MTJ element 12 is deposited over the contact hole PB and planarized, and the upper portion of the contact hole PB is filled with the material, thereby forming the second contact 19. That is, the first contact 18 is etched back for recessing, and thereafter the second contact 19 is formed on the first contact 18. An Applicable example of the material of the second contact 19 is Ta. But, as mentioned above, it is also possible to apply TaN, TiN, Al, Si, Hf and W.

Figure 6:
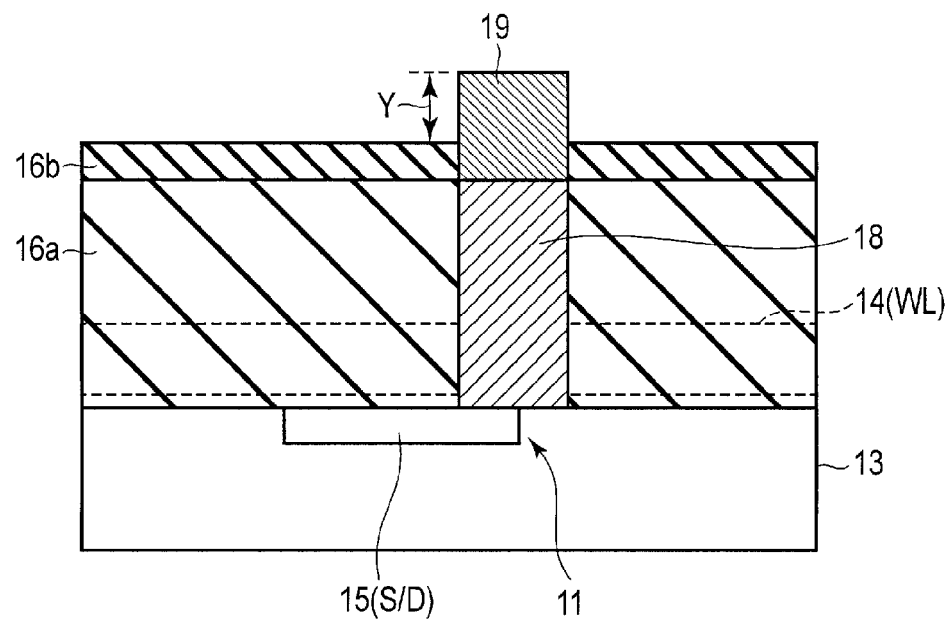

Next, as shown in FIG. 6, interlayer insulator layer 16c is selectively etched back, and thus side surfaces of the second contact 19 are exposed. Interlayer insulator layer 16b functions as an etching stopper for interlayer insulator layer 16c. In this figure, Y indicates the etch-back amount of interlayer insulator layer 16c. Y is parallel to the direction of stack of interlayer insulator layers 16a to 16c.

Figure 7:
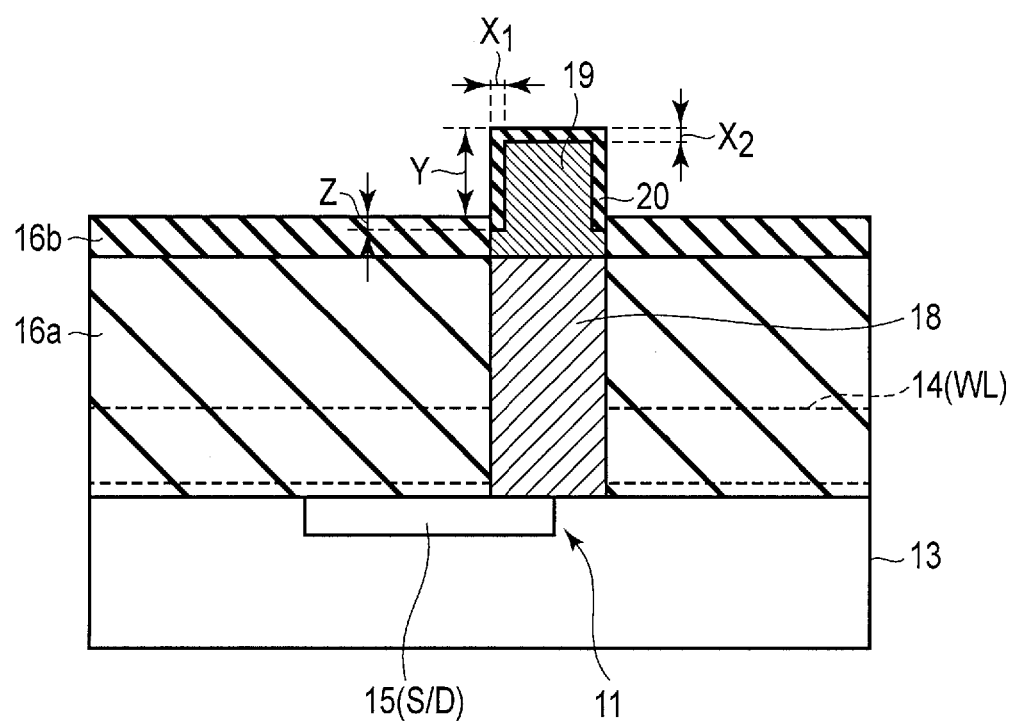

Next, as shown in FIG. 7, the surface of the second contact 19 is partially oxidized, and thus the first layer 20 is formed to surround the second contact 19. The first layer 20 is a layer formed to oxidize the second contact 19. The first layer 20 is situated above the surface of the interlayer insulator layer 16 and within the contact hole PB, and covers the surrounding of the second contact 19. That is, in the direction of stack of the MTJ element, the portion of the second contact 19 which is exposed above from the contact hole PB (etch-back amount of Y), and the portion of the second contact 19 which is located in the contact hole PB (Z described later) are oxidized.

In the figure, $X_1$ and $X_2$ indicate the oxidization amount of the second contact 19. $X_1$ is taken in a direction orthogonal to the direction of stack of interlayer insulator layers 16a to 16c (orthogonal to Y). On the other hand, $X_2$ is taken in a direction parallel to the direction of stack of the interlayer insulator layers 16a to 16c (orthogonal to $X_1$ and parallel to Y).

Reference symbol Z indicates an oxidized layer located in the contact hole PB in the direction of stack of interlayer insulator layers 16a to 16c (Y-direction).

The oxidization of the second contact 19 is, for example, plasma oxidization. When the material of the second contact 19 is, for example, Ta, the first layer 20 is formed of, for example, TaOx. Or when the material of the second contact 19 is Hf, the first layer 20 is formed of, for example, HfOx.

The first layer 20 may be a nitride in place of an oxide. It is also possible to apply, for example, TaN or TiN.

The first layer 20 can be controlled by the etch-back amount Y of interlayer insulator layer 16c, and oxidization amount $X_1$, $X_2$ or Z of the second contact 19. The etch-back amount Y is greater than oxidization amount $X_1$ ($Y>X_1$). That is, the first layer 20 has such a structure that it is thick in the depth direction (Y-direction) of the overetched portion, which will be described later.

Figure 8:
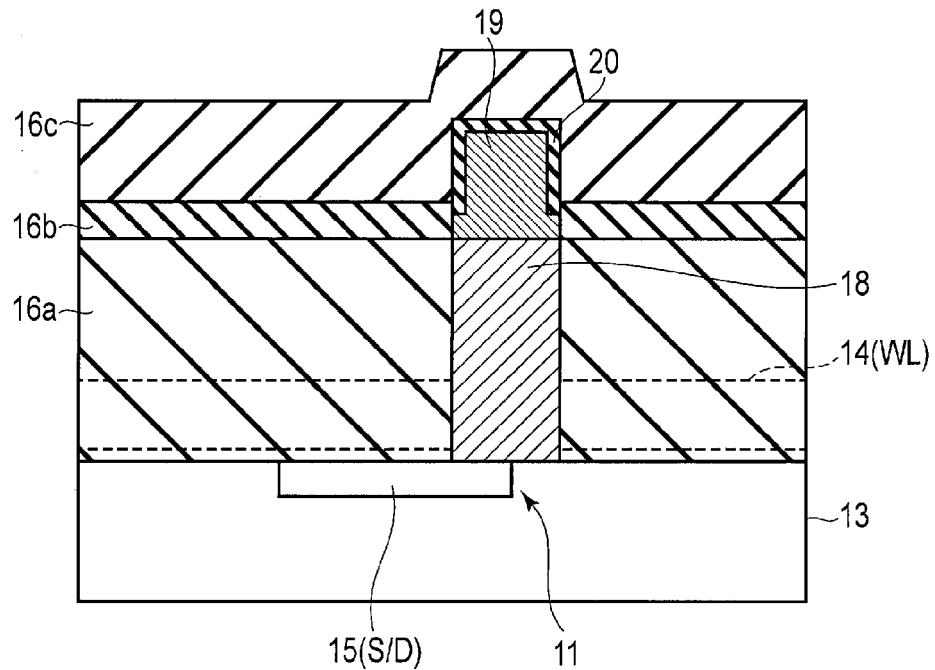

Next, as shown in FIG. 8, interlayer insulator layer 16c is deposited on the entire surface. An applicable example of the material of interlayer insulator layer 16c is silicon oxide SiOx.

Figure 9:
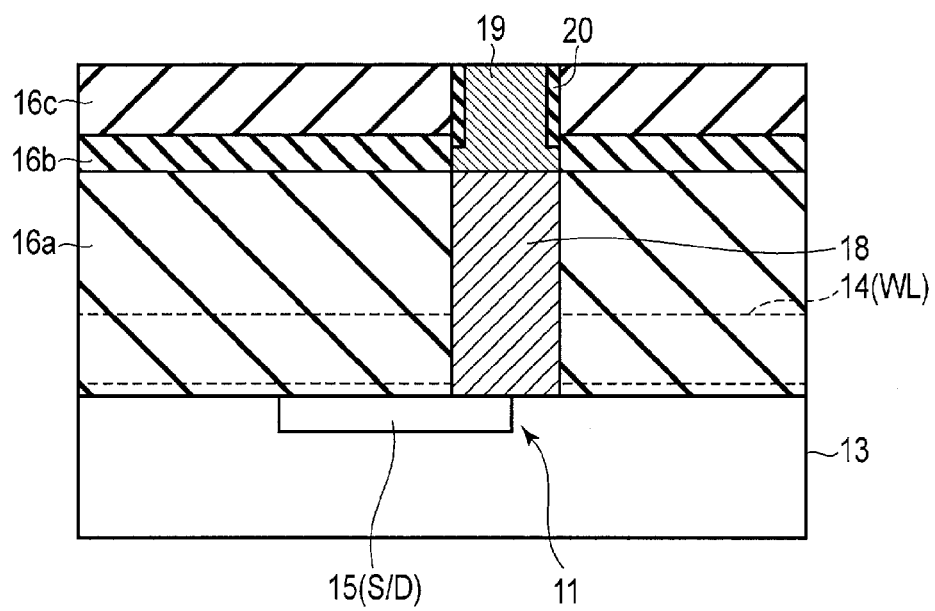

After that, as shown in FIG. 9, the surface of the interlayer insulator layer 16c is planarized by CMP until the surface of the second contact 19 is exposed. During this operation, the portion of the first layer 20 which is formed on a surface of the second contact 19 where an MTJ element is to be formed is scraped off. In other words, the first layer 20 is formed on only the sidewall of the second contact 19. Thus, the MTJ element and the second contact 19 are electrically connected to each other.

As described above, the first layer 20 is formed around the second contact 19.

Here, the material of the second contact 19, which constitutes the upper portion of the lower contact plug 17, comprises the same element as that of the material formed around the second contact 19. Consequently, it is possible to prevent a step being produced or dishing from occurring in the second contact 19 or the first layer 20 in the planarizing process by CMP. Note that when the material of the second contact 19 is Ta, which is an easily oxidizable metal, a TaOx layer is formed on an exposed surface of the second contact 19 (Ta) by natural oxidization or chemical action of CMP for planarization.

Next, the natural oxide layer (metal oxide) formed on the surface of the second contact 19 is etched back and removed by, for example, dry-etching. In this embodiment, the material of the second contact 19 and the material of the first layer 20 formed around the second contact 19 comprise the same element. With this structure, the etching rate for etching back the natural oxide layer on the surface of the second contact 19 is the same as that for the first layer 20. Therefore, it is possible to prevent a step from being produced in the border between the second contact 19 and the first layer 20.

After that, as shown in FIG. 10, the MTJ element 12 is formed on the second contact 19 and the first layer 20. More specifically, on the second contact 19 and the first layer 20 both of the surfaces already planarized, materials of ferromagnetic layers 12a and 12c and barrier layer 12b are laminated one on another. With this structure, the deformation of ferromagnetic layers 12a and 12c and barrier layer 12b can be prevented. Reactive ion etching (RIE) or ion beam etching (IBE) is then carried out using a hard mask (not shown), and thus the materials of ferromagnetic layers 12a and 12c and barrier layer 12b are etched.

Figure 11:
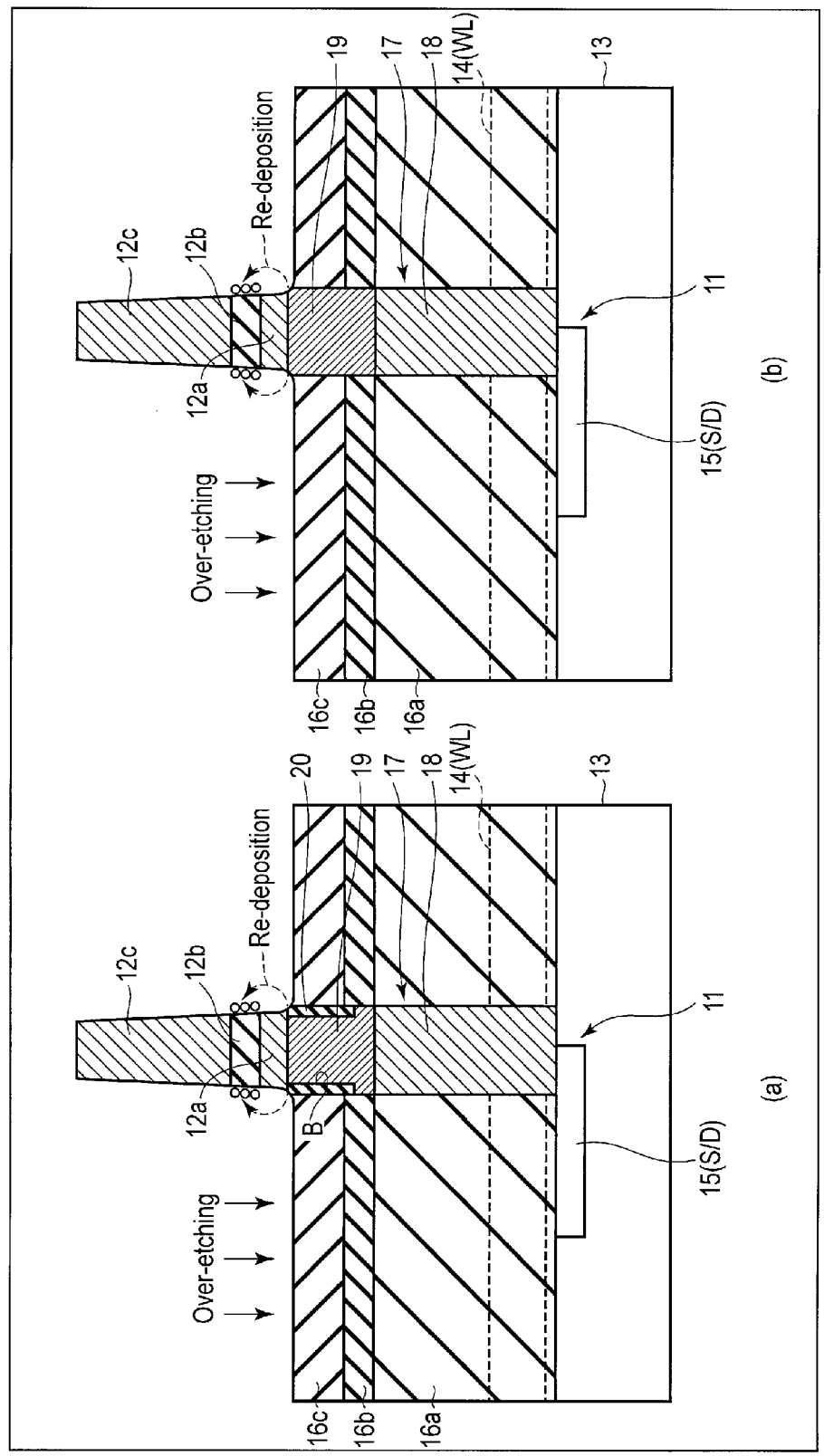
FIG. 11 is a cross-sectional view showing the first embodiment and a comparative example thereof.

At this stage, the overetching of the MTJ element is carried out in order to separate it. But according to this embodiment, even if the overetching is carried out, the second contact 19 is not exposed, thereby preventing metal material of the second contact 19 from redepositing onto the sidewall of the MTJ element. In this manner, the characteristics of the MTJ element will not be degraded. That is, according to this embodiment, as shown in FIG. 11(a), with this overetching, the first layer 20 is etched. During the overetching, part of the element material of the first layer 20, which once gasified, attaches to the sidewall of barrier layer 12b. Since the first layer 20 is an oxide, no leakage path is created between materials of ferromagnetic layers 12a and 12c. On the other hand, if the first layer 20 is not present as shown in FIG. 11(b), metal element of the second contact 19 redeposits onto the sidewall of the MTJ element during the overetching thereof, thus resulting in degradation of characteristics of the MTJ element. As described, in this embodiment, the first layer 20, which is oxidized, is formed around the second contact 19. Therefore, if the MTJ element is overetched deeply in the direction of stack (Y-direction), a leakage path is not created in the MTJ element.

Note that in the direction parallel to the layer surface of the MTJ element, diameter $D_{MTJ}$ of ferromagnetic layer 12a is greater than diameter $D_{DE}$ of the second contact 19 ($D_{MTJ}>D_{DE}$). That is, the size of the surface of the second contact 19 is less than that of the bottom surface of the MTJ element. Note that the first layer 20 may be formed in sections other than the bottom surface of the MTJ element.

Further, a sidewall A of the MTJ element needs to be located on an outer side of a sidewall B of the second contact 19, that is, the border between the second contact 19 and the first layer 20. This is because the second contact 19 should not be exposed during the overetching.

In this embodiment, the planer pattern of the MTJ element is circular, although it is not limited thereto, but it may be rectangular. In this embodiment, the stack structure of layers 12a, 12b and 12c which constitute the MTJ element has a tapered shape whose width reduces in an upward direction. Therefore, layers 12a, 12b and 12c which constitute the MTJ element, ferromagnetic layer 12a has the greatest diameter.

Next, a protective layer 21 is formed on interlayer insulator layer 16c to cover the first layer 20 and the MTJ element 12. Note that a sidewall mask layer may be provided between the MTJ element 12 and the protective layer 21 to cover the sidewall of the MTJ layer 12.

Note that the further detailed descriptions of the MTJ element 12 and the manufacturing process from then will be omitted.

With the manufacturing process described above, a semiconductor memory device according to the first embodiment is completed.

Modified Example of First Embodiment

FIG. 12 shows a modified example of the first embodiment. In the first embodiment, a first layer 20 is formed around a second contact 19. By contrast, in this modified example, a stopper layer SL is formed between the second contact 19 and the first layer 20. The stopper layer SL is, for example, an anti-oxidization layer (an oxidization stopper) or anti-nitriding layer (a nitriding stopper). The following descriptions will be given for an example case where the stopper layer SL is the oxidization stopper.

The structure shown in FIG. 12 can be prepared with the production steps shown in FIGS. 13 to 17. Note that the manufacturing process before the step shown in FIG. 13 is similar to those shown in FIGS. 3 and 4.

That is, as shown in FIG. 13, after the first contact 18 in the contact hole PB is etched back, portion 19a of the second contact 19 is deposited on the entire surface. Portion 19a of the second contact 19 is formed on an interlayer insulator layer 16c and on a sidewall and bottom of a contact hole PB.

Next, the stopper layer SL is formed on portion 19a of the second contact 19. The stopper layer SL comprises, for example, a nitride such as TaN or TiN. This layer may be formed by depositing a nitride material on portion 19a of the second contact 19 or by nitriding portion 19a of the second contact 19.

The stopper layer SL is more difficult to oxidize than portion 19a of the second contact 19. Thus, the stopper layer SL can serve as a stopper layer against the oxidization of portion 19a of the second contact 19. It suffices if the stopper layer SL is formed between the second contact 19 and a first layer 20, which will be described later. The stopper layer SL may not be present in an area other than that where the first layer 20 is formed. Note that when the stopper layer SL is formed in a current path of the second contact 19, it is desirable that the stopper layer SL be made of a conductive material. This is because, an MTJ element and a lower contact plug 17 should be electrically connected to each other.

Next, the material of a remainder portion 19b of the second contact 19 is deposited on the entire surface.

The second contact 19 may be formed of two layers of portions 19a and 19b with the stopper layer SL between the two layers.

After that, portion 19a of the second contact 19, the stopper layer SL and the remainder portion 19b of the second contact 19 are planarized by, for example, CMP until interlayer insulator layer 16c is exposed.

In this case as well, the materials of these layers subjected to planarization contain the same element. Therefore, it is possible to prevent a step from being produced or dishing from occurring between the layers subjected to the planarizing process by CMP.

Further, since the materials of the second contact 19 (portions 19a and 19b) and the stopper layer SL are made of the same element, the production of a step a border between the second contact 19 (portions 19a and 19b) and the stopper layer SL can be prevented during the etch-back process of removing the natural oxide layer formed on the surface of the second contact 19.

Next, interlayer insulator layer 16c is selectively etched back, a side surface of the portion 19a of the second contact 19 is exposed as shown in FIG. 14.

After that, as shown in FIG. 15, the second contact 19 is oxidized to form a first layer 20. The first layer 20 is formed around the remaining portion 19b of the second contact 19 via the stopper layer SL.

The stopper layer SL is more difficult to oxidize than portion 19a of the second contact 19. Therefore, the oxidization substantially is finished when it reaches the stopper layer SL.

The first layer 20 is located above the surface of interlayer insulator layer 16b (etch-back amount Y) and in the contact hole PB (Z), so as to cover and surround the second contact 19 via the stopper layer SL.

The oxidization of the second contact 19 is, for example, plasma oxidization. When the material of the second contact 19 is, for example, Ta, the first layer 20 is formed of, for example, TaOx. Or when the material of the second contact 19 is Hf, the first layer 20 is formed of, for example, HfOx.

The first layer 20 may be a nitride in place of an oxide. It is also possible to apply, for example, TaN or TiN.

The first layer 20 can be controlled by the etch-back amount Y of interlayer insulator layer 16c, and oxidization amount $X_1$, $X_2$ or Z of the second contact 19. The etch-back amount Y is greater than oxidization amount $X_1$ ($Y>X_1$). That is, the first layer 20 has such a structure that it is thick in the depth direction (Y-direction) of the overetched portion, which will be described later.

Next, as shown in FIGS. 16 and 17, interlayer insulator layer 16c is deposited on the entire surface, and the surface of interlayer insulator layer 16c is planarized by CMP. Then, the process of forming a protective layer 21 to cover an MTJ element is carried out as in the embodiment shown in FIGS. 8 to 10.

Figure 18:
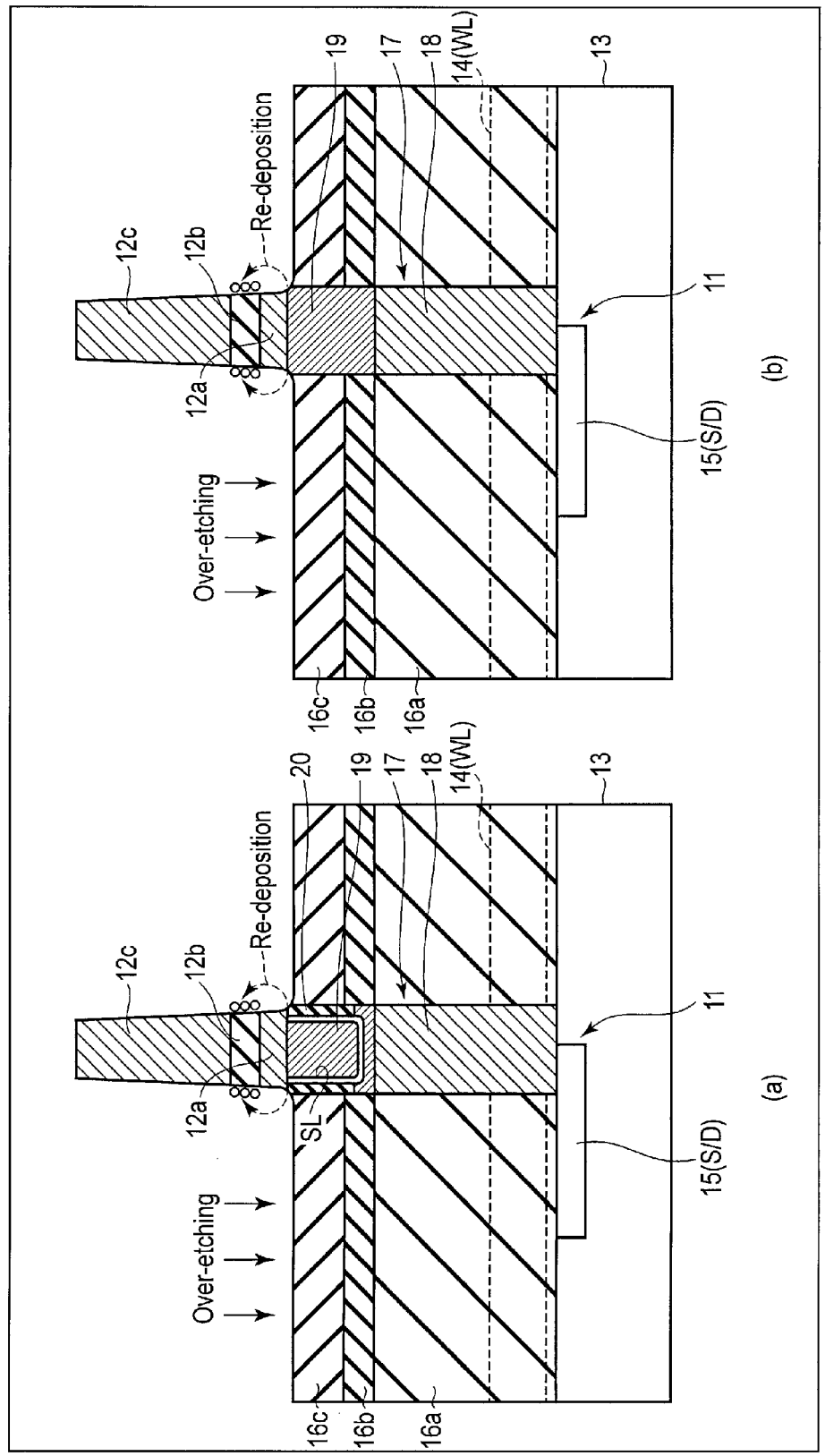
FIG. 18 is a cross-sectional view showing the modified example of the first embodiment and a comparative example thereof.

According to this example, as shown in FIG. 18(a), the first layer 20, which is oxidized, is formed around the second contact 19 via the stopper layer SL. Therefore, if the MTJ element is overetched deeply in the direction of stack (Y-direction), a leakage path is not created in the MTJ element. On the other hand, if the first layer 20 is not present as shown in FIG. 18(b), metal element of the second contact 19 redeposits onto the sidewall of the MTJ element during the overetching thereof, thus resulting in degradation of characteristics of the MTJ element.

Note that in the direction parallel to the layer surface of the MTJ element, diameter $D_{MTJ}$ of ferromagnetic layer 12a is greater than diameter $D_{DE}$ of the remaining portion 19b of the second contact 19 ($D_{MTJ}>D_{DE}$). That is, the size of the surface of the remaining portion 19b of the second contact 19 is less than that of the bottom surface of the MTJ element. Note that the first layer 20 may be formed in sections other than the bottom surface of the MTJ element. The first layer 20 partially covers the bottom surface of the MTJ element.

The MTJ element 12 is formed on a flat underlying layer comprising the second contact 19, the stopper layer SL and the first layer 20. With this structure, even if the size of the surface of the second contact 19 is less than that of the bottom surface of the MTJ element, the deformation of the barrier layer in the MTJ element 12 can be prevented. Consequently, the short-circuiting error between the ferromagnetic layers and inadequate magnetic properties, that is, the degradation in the coercive force Hc of the storage layer, or in magnetoresistance ratio MR can be prevented.

With the above-described modified example, an advantageous effect similar to that of the first embodiment can be obtained. Further, in this example, the stopper layer SL is provided between the second contact 19 and the first layer 20. With this structure, it is more easily to control the oxidization as compared to the first embodiment.

As described above, according to the present embodiment, an oxidized layer which is elongated in the overetching direction is provided around the second contact 19. With this structure, it is possible to prevent the formation of a leakage path in the MTJ element if overetching is sufficiently carried out. Further, with the sufficient overetching, leakage between MTJ elements can be inhibited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a magnetic tunnel junction (MTJ) element comprising a first magnetic layer, a second magnetic layer and a non-magnetic layer between the first and second magnetic layers;
a contact layer formed underneath the MTJ element, the contact layer being formed of a first material and comprising an upper portion and a lower portion, wherein a size of the upper portion in a direction parallel to a layer surface of the MTJ element is smaller than a size of the lower portion in the direction parallel to the layer surface of the MTJ element;
a first layer formed around the contact layer and in contact with a side surface of the upper portion of the contact layer and an upper surface of the lower portion of the contact layer; and
a stopper layer provided between the contact layer and the first layer,
wherein the first layer in contact with the side surface of the upper portion of the contact layer, has a first width extending parallel to a stacking direction of the MTJ element, and a second width extending perpendicularly to the direction of extension of the first width, and the second width is less than the first width.

2. The device according to claim 1, wherein the first material comprises one of Ta, Ti, Al, Si, Hf and W.

3. The device according to claim 1, wherein the first layer is an oxide of the first material.

4. The device according to claim 1, wherein the first layer is a nitride of the first material.

5. The device according to claim 1, wherein a level of a surface of the first layer is equal to a level of a surface of the contact layer.

6. The device according to claim 1, wherein the size of the surface of the upper portion of the contact layer in the direction parallel to the layer surface of the MTJ element is smaller than a size of a bottom surface of the MTJ element.

7. The device according to claim 6, wherein the bottom surface of the MTJ element is formed on the surface of the contact layer and the surface of the first layer.

8. The device according to claim 1, wherein the first layer is formed on a portion other than the bottom surface of the MTJ element.

9. The device according to claim 1, wherein the stopper layer is a nitride containing the first material.

10. A semiconductor memory device comprising:
a transistor formed within a semiconductor substrate, the transistor comprising a first diffusion layer, a second diffusion layer and a gate electrode;
a contact layer formed on the first diffusion layer of the transistor, the contact layer being formed of a first material and comprising an upper portion and a lower portion;
a first layer formed around the contact layer and in contact with a side surface of the upper portion of the contact layer and an upper surface of the lower portion of the contact layer;
a magnetic tunnel junction (MTJ) element formed at least on the contact layer; and
a stopper layer provided between the contact layer and the first layer,
wherein:
a size of the upper portion of the contact layer in a direction parallel to a layer surface of the MTJ element is smaller than a size of the lower portion of the contact layer in the direction parallel to the layer surface of the MTJ element, and
the first layer in contact with the side surface of the upper portion of the contact layer, has a first width extending parallel to a stacking direction of the MTJ element, and a second width extending perpendicularly to the direction of extension of the first width, and the second width is less than the first width.

11. The device according to claim 10, wherein the first material comprises one of Ta, Ti, Al, Si, Zr, Hf and W.

12. The device according to claim 10, wherein the first layer is an oxide of the first material.

13. The device according to claim 10, wherein the first layer is a nitride of the first material.

14. The device according to claim 10, wherein a level of a surface of the first layer is equal to a level of a surface of the contact layer.

15. The device according to claim 10, wherein the size of the surface of the upper portion of the contact layer in the direction parallel to the layer surface of the MTJ element is smaller than a size of a bottom surface of the MTJ element.

16. The device according to claim 15, wherein the bottom surface of the MTJ element is formed on the surface of the contact layer and the surface of the first layer.

17. The device according to claim 10, wherein the first layer is formed on a portion other than the bottom surface of the MTJ element.

18. The device according to claim 10, wherein the stopper layer is a nitride containing the first material.

19. A method of manufacturing a semiconductor memory device, the method comprising:
forming a transistor within a semiconductor substrate, the transistor comprising a first diffusion layer, a second diffusion layer and a gate electrode;
forming an interlayer insulator layer on the semiconductor substrate;
forming a contact layer in the interlayer insulator layer on the first diffusion layer of the transistor, the contact layer being formed of a first material;
etching the interlayer insulator layer to expose a portion of the contact layer;
forming a first layer around the contact layer by oxidizing or nitriding the exposed portion of the contact layer; and
forming a magnetic tunnel junction (MTJ) element on the contact layer,
wherein a size of an upper portion of the contact layer in a direction parallel to a layer surface of the MTJ becomes smaller than a size of a lower portion of the contact layer by the oxidizing or the nitriding.

20. The method of claim 19, wherein the first layer is an oxide of the first material.

21. The method of claim 19, wherein the size of the surface of the upper portion of the contact layer in the direction parallel to the layer surface of the MTJ element is smaller than a size of a bottom surface of the MTJ element.

22. The method of claim 21, wherein the bottom surface of the MTJ element is formed on the surface of the contact layer and the surface of the first layer.

23. The method of claim 19, further comprising:
forming a contact hole in the interlayer insulator layer;
forming a portion of the contact layer in the contact hole;
forming a stopper layer on a portion of the contact layer; and
forming a remaining portion of the contact layer on the stopper layer.

* * * * *